United States Patent
Mitsuishi et al.

(10) Patent No.: US 8,569,943 B2
(45) Date of Patent: Oct. 29, 2013

(54) LUMINESCENT MATERIAL

(75) Inventors: Iwao Mitsuishi, Machida (JP); Naotoshi Matsuda, Chigasaki (JP); Yumi Fukuda, Tokyo (JP); Keiko Albessard, Yokohama (JP); Aoi Okada, Kawasaki (JP); Masahiro Kato, Naka-gun (JP); Ryosuke Hiramatsu, Yokohama (JP); Yasushi Hattori, Kawasaki (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,433

(22) Filed: Aug. 31, 2012

(65) Prior Publication Data

US 2013/0229106 A1 Sep. 5, 2013

(30) Foreign Application Priority Data

Nov. 16, 2011 (JP) ................. 2011-250597

(51) Int. Cl.
*H01J 1/63* (2006.01)
*C09K 11/64* (2006.01)
*C09K 11/54* (2006.01)

(52) U.S. Cl.
USPC .................. 313/483; 313/512; 252/301.4 R; 252/301.6 R; 252/301.4 F

(58) Field of Classification Search
USPC ................. 313/483, 498–512; 252/301.4 R, 252/301.6 R, 301.4 F
See application file for complete search history.

(56) References Cited

U.S. PATENT DOCUMENTS

| | | |
|---|---|---|
| 2009/0096361 A1 | 4/2009 | Fukuda et al. |
| 2011/0057149 A1 | 3/2011 | Fukuda et al. |
| 2011/0058582 A1 | 3/2011 | Fukuda et al. |
| 2011/0058583 A1 | 3/2011 | Fukuda et al. |
| 2011/0176084 A1 | 7/2011 | Akiho et al. |
| 2012/0049115 A1 | 3/2012 | Matsuda et al. |
| 2012/0062103 A1 | 3/2012 | Okada et al. |
| 2012/0062106 A1 | 3/2012 | Okada et al. |

FOREIGN PATENT DOCUMENTS

| | | |
|---|---|---|
| EP | 2 003 183 A1 | 12/2008 |
| JP | 2006-45271 | 2/2006 |
| JP | 2006-52337 | 2/2006 |
| JP | 4052136 | 12/2007 |
| JP | 4165318 | 8/2008 |
| WO | WO 2007/004138 A2 | 1/2007 |
| WO | WO 2007/004138 A3 | 1/2007 |

OTHER PUBLICATIONS

Extended European Search Report issued May 3, 2013, in European Patent Application No. 12181855.3.
Yumi Fukuda, et al.,"Luminescence Properties of $Eu^{2+}$ -Doped Green-Emitting Sr-Sialon Phosphor and its Application to White Light-Emitting Diodes", Applied Physics Express, vol. 2, No. 1, XP-001520112, Jan. 1, 2009, 3 pages.
Kousuke Shioi, et al., "Synthesis, crystal structure and photoluminescence of Eu-α-SiAlON", Journal of Alloys and Compounds, vol. 504, No. 2, XP-027181906, Aug. 20, 2010, pp. 579-584.
Nobuo Ishizawa, et al., "$Sr_3(Al_{3+x}si_{13-x}) (N_{21-x}O_{2+x}):Eu^{2+}(x-0)$: a monoclinic Modification of Sr-Sialon", Acta Cryst.. vol. 64, No. 2, XP-055060404, 2010, 16 pages.

*Primary Examiner* — Joseph L Williams
(74) *Attorney, Agent, or Firm* — Oblon, Spivak, McClelland, Maier & Neustadt, L.L.P.

(57) ABSTRACT

According to one embodiment, the luminescent material emits light having an luminescence peak within a wavelength range of 550 to 590 nm when excited with light having an emission peak in a wavelength range of 250 to 520 nm. The luminescent material has a composition represented by the following formula 1.

$$(Sr_{1-x}Eu_x)_a Si_b Al O_c N_d \qquad \text{formula 1}$$

wherein x, a, b, c and d satisfy following condition:

$0 < x \leq 0.16$, $0.50 \leq a \leq 0.70$, $2.0 \leq b \leq 2.5$ $0.45 \leq c \leq 1.2$, $3.5 \leq d \leq 4.5$, and $3.6 \leq d/c \leq 8.0$.

19 Claims, 10 Drawing Sheets

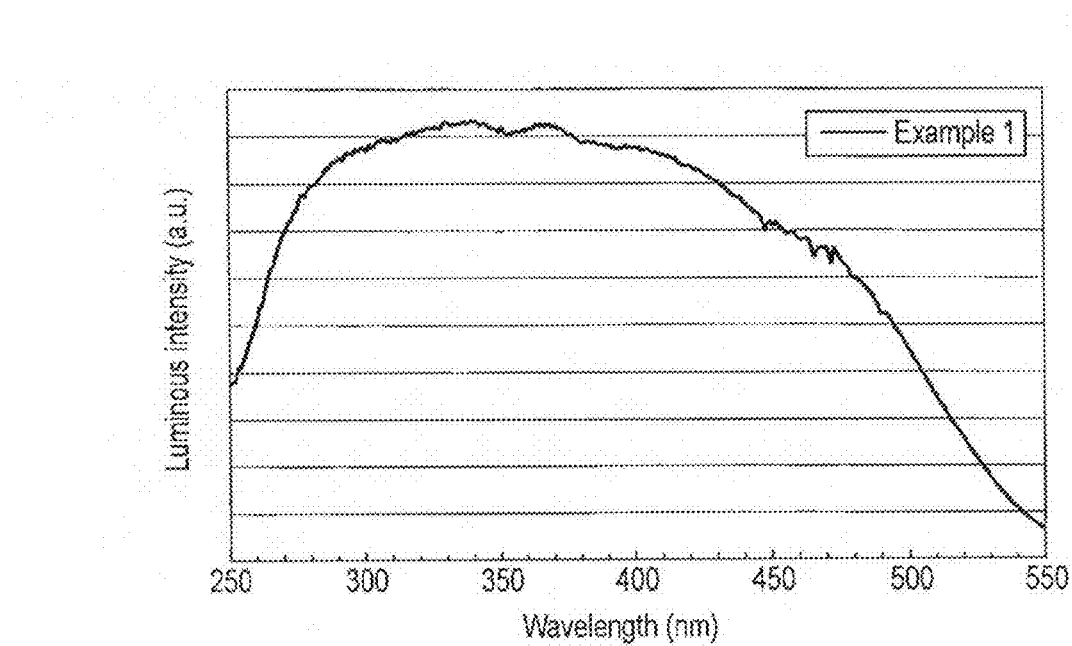
F I G. 7
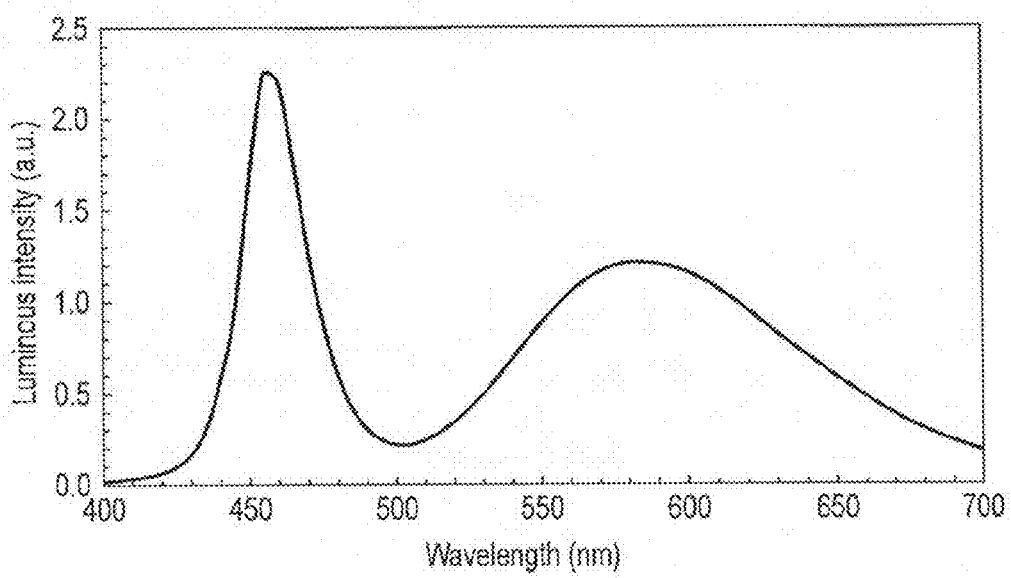
F I G. 8

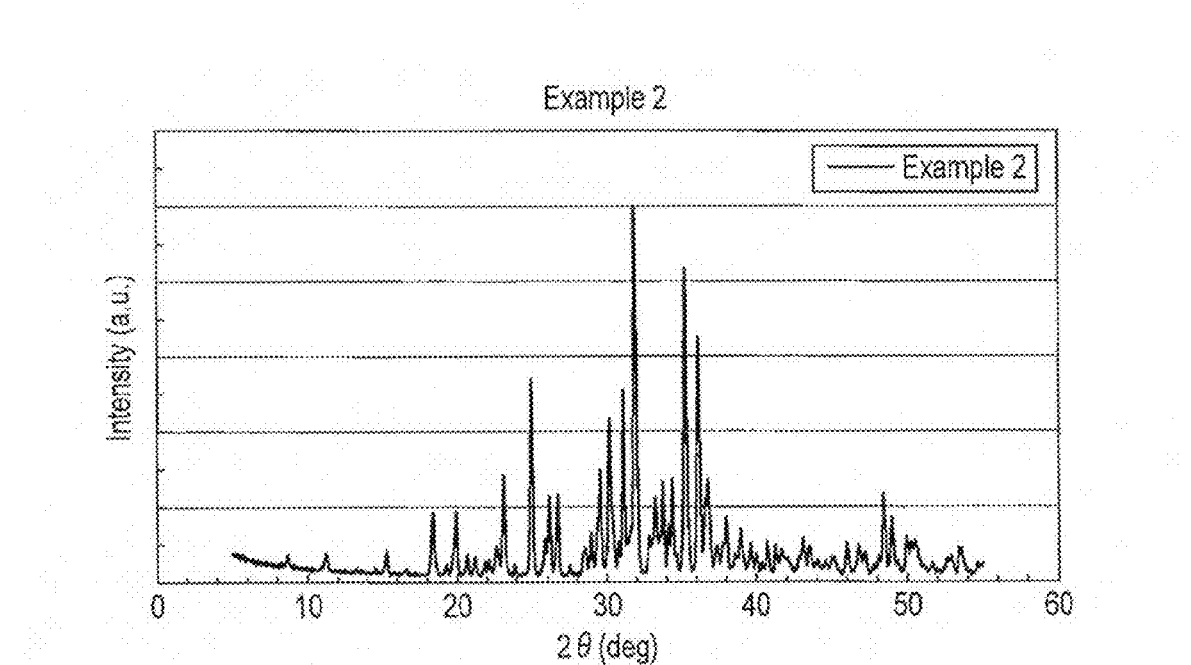
F I G. 9
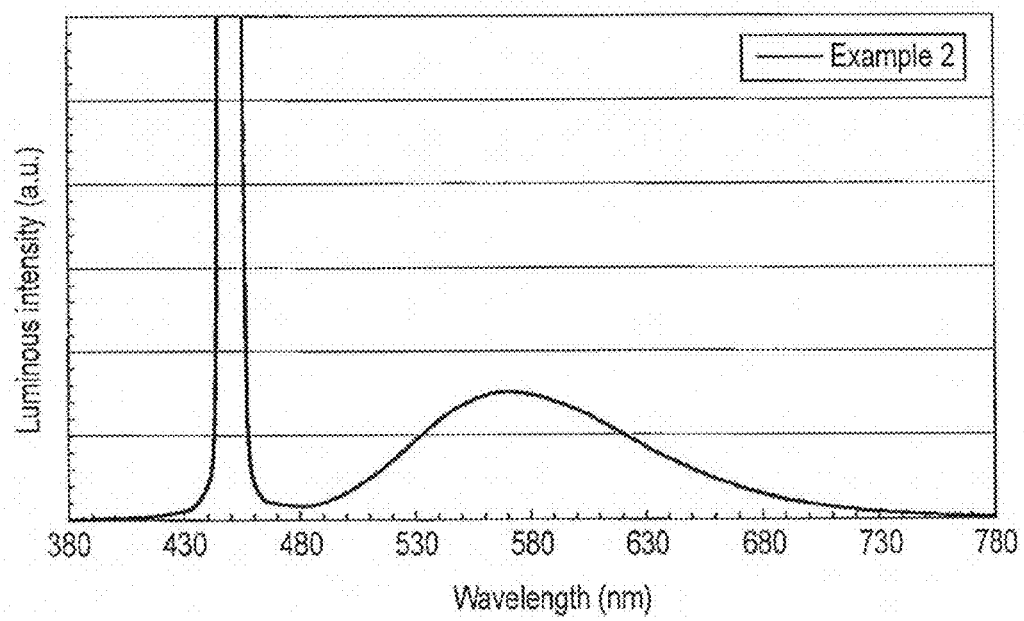
F I G. 10

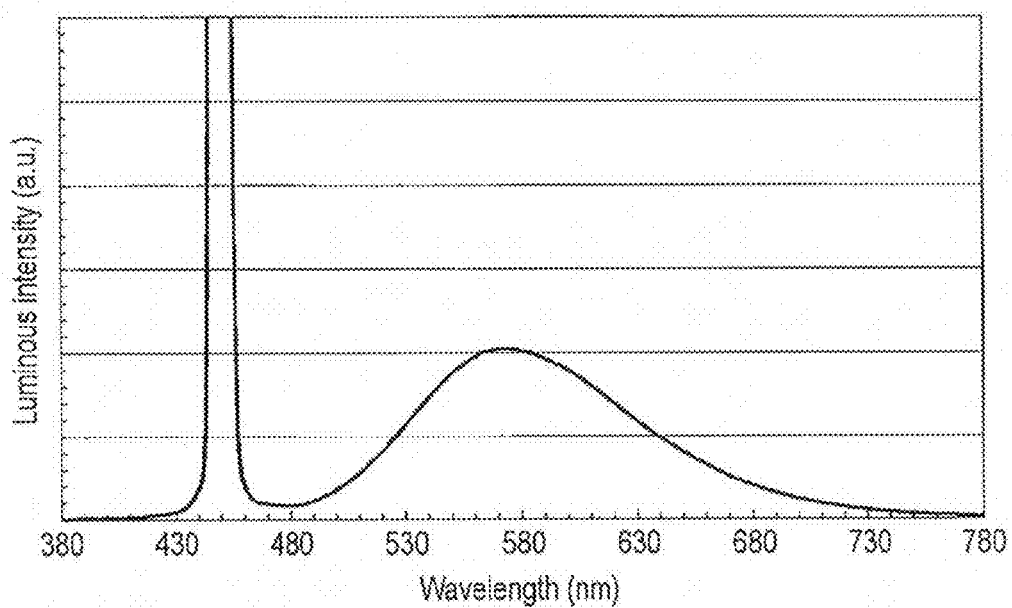
F I G. 13
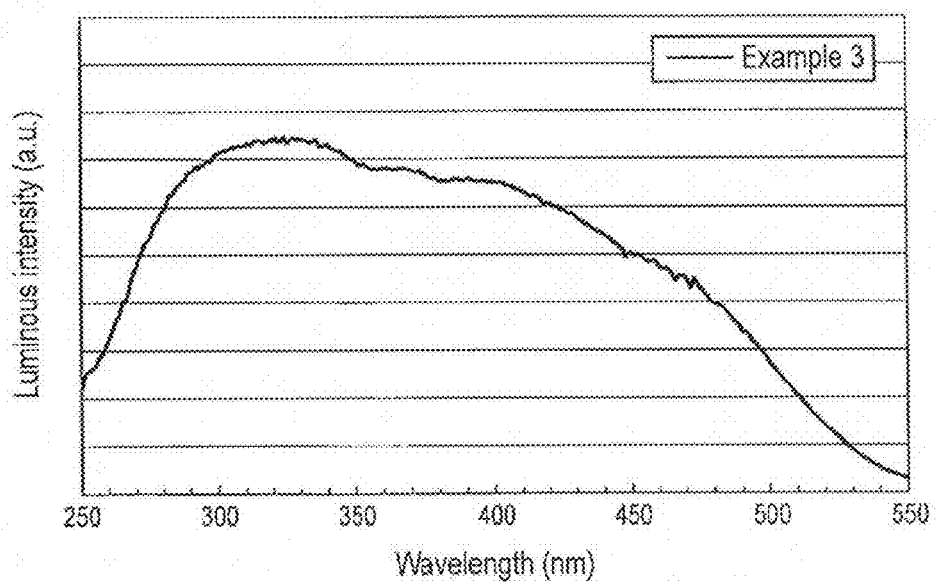
F I G. 14

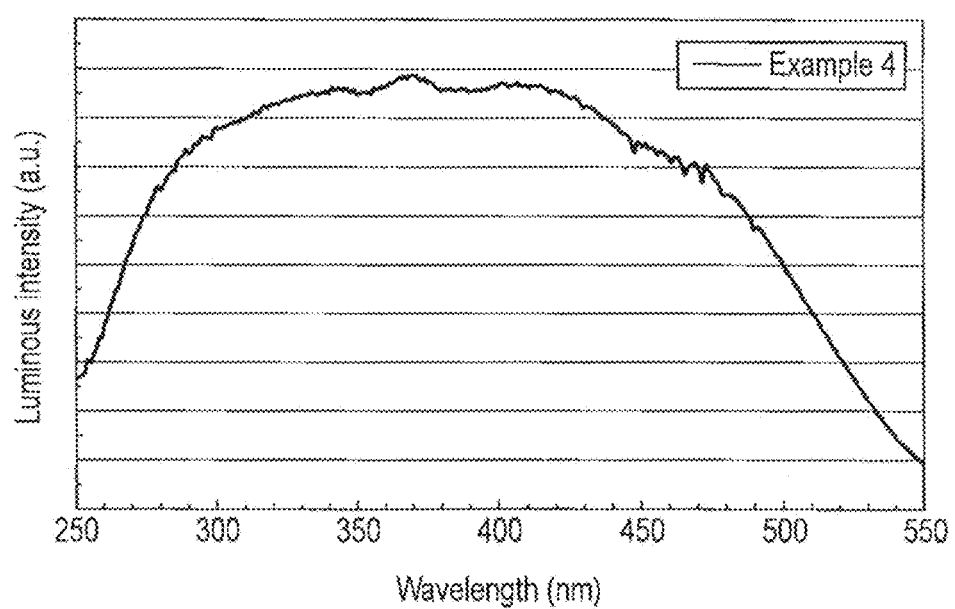
F I G. 17

LUMINESCENT MATERIAL

CROSS-REFERENCE TO RELATED APPLICATIONS

This application is based upon and claims the benefit of priority from Japanese Patent Application No. 2011-250597, filed Nov. 16, 2011, the entire contents of which are incorporated herein by reference.

FIELD

Embodiments described herein relate generally to a luminescent material, a light-emitting device, and a method for manufacturing a luminescent material.

BACKGROUND

A white light-emitting device is formed by combining, for example, a luminescent material that emits red light by excitation with blue light, a luminescent material that emits green light by excitation with blue light, and a blue LED. The use of a luminescent material that emits yellow light having a luminescence peak in a wavelength range of 550 to 590 nm by excitation with blue light allows a white light-emitting device to be formed using fewer kinds of luminescent materials. As the yellow light-emitting luminescent material, for example a sialon is known.

Requirements of the luminous efficiency, the chromaticity, the temperature property and the luminescence emission spectrum half width are increasingly demanding for the yellow light-emitting luminescent material.

BRIEF DESCRIPTION OF THE DRAWINGS

FIG. 7 is an excitation spectrum of the luminescent material (Y1) of Example;
FIG. 8 is a luminescence emission spectrum of a light-emitting device of Example;
FIG. 9 is an XRD pattern of a luminescent material (Y2) of Example;
FIG. 10 is a luminescence emission spectrum when the luminescent material (Y2) of Example is excited with light having a wavelength of 450 nm;
FIG. 13 is a luminescence emission spectrum when the luminescent material (Y3) of Example is excited with light having a wavelength of 450 nm;
FIG. 14 is an excitation spectrum of the luminescent material (Y3) of Example;
FIG. 17 is an excitation spectrum of the luminescent material (Y4) of Example.

DETAILED DESCRIPTION

Figure 1A:
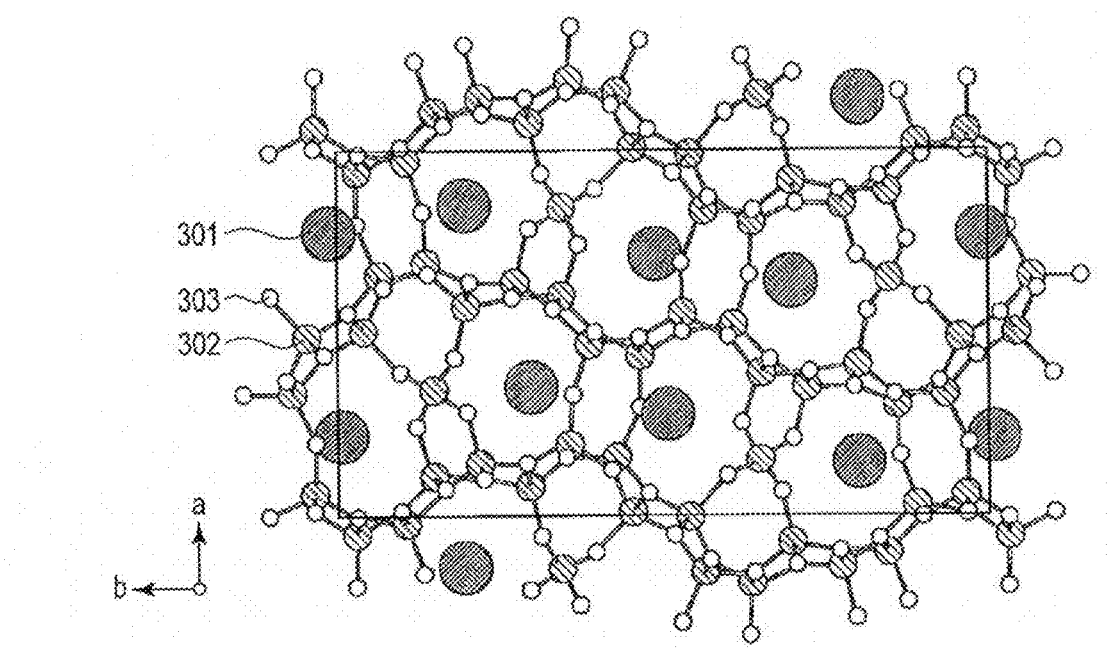
FIGS. 1A, 1B and 1C each show a crystal structure of $Sr_2Al_3Si_7ON_{13}$.

In general, according to one embodiment, a luminescent material is a yellow light-emitting luminescent material because the luminescent material shows a luminescence peak in a wavelength range of 550 to 590 nm when excited with light having an emission peak in a wavelength range of 250 to 520 nm. Such a luminescent material includes a parent material having a crystal structure substantially same as the crystal structure of $Sr_2Al_3Si_7ON_{13}$, and the parent material is activated by Eu. The composition of the yellow light-emitting luminescent material according to this embodiment is represented by the following formula 1.

$$(Sr_{1-x}Eu_x)_a Si_b AlO_c N_d \quad \text{formula 1}$$

wherein x, a, b, c and d satisfy following condition:

$0 < x \leq 0.16$, $0.50 \leq a \leq 0.70$, $2.0 \leq b \leq 2.5$ $0.45 \leq c \leq 1.2$, $3.5 \leq d \leq 4.5$, and $3.6 \leq d/c \leq 8.0$.

As shown in the formula 1, the luminescence center element Eu replaces a part of Sr. If at least 0.1 mol % of Sr is replaced by Eu, a sufficient luminous efficiency can be obtained. If the amount of replacement by Eu is too large, the luminous efficiency is reduced (concentration quenching). For avoiding this, the upper limit of x is set to 0.16. x is preferably 0.01 to 0.10. A part of Sr may be replaced by at least one selected from Ba, Ca and Mg. Even though at least one selected from Ba, Ca and Mg is contained, generation of a heterophase is not promoted as long as the ratio thereof is 15 at. %, more preferably 10 at. %, of the total of Sr and at least one selected from Ba, Ca and Mg.

If a is less than 0.50, a heterophase showing a blue luminescence is generated. On the other hand, if a is greater than 0.70, a heterophase showing a green luminescence is generated. a is preferably 0.55 to 0.65.

If b is less than 2.0, a heterophase showing a blue-green luminescence is generated. On the other hand, if b is greater than 2.5, a heterophase showing a green luminescence is generated. b is preferably 2.1 to 2.3.

If c is less than 0.45, a reduction in the luminous efficiency is observed. On the other hand, if c is greater than 1.2, a blue-green light-emitting heterophase is generated. c is preferably 0.7 to 1.1.

If d is less than 3.5, the luminous wavelength is increased, and if d is greater than 4.5, a green light-emitting heterophase is generated. d is preferably 3.9 to 4.2.

If (d/c) representing a ratio of N and O is less than 3.6, a heterophase showing a blue-green luminescence is generated. On the other hand, if (d/c) is 8.0 or greater, the luminous wavelength exceeds 590 nm, and no yellow luminescence is obtained. (d/c) is preferably 3.7 to 6.0.

The luminescent material according to this embodiment satisfies all the requirements described above, and therefore can emit yellow light having a broad luminescence emission spectrum half width and an excellent chromaticity with high efficiency when excited with light having an emission peak in a wavelength range of 250 to 520 nm. Moreover, the yellow light-emitting luminescent material also has a good temperature property.

The yellow light-emitting luminescent material of this embodiment is a compound that is based on a $Sr_2Al_3Si_7ON_{13}$ crystal and has a part of Sr replaced by Eu. The amount of constituent element Sr, Eu, Si, Al, O or N may be deviated from a described value (the number of moles). The crystal structure may slightly change due to a difference in the amount, but the atom position hardly changes significantly so that chemical bonds between backbone atoms are broken. The atom position is given by a crystal structure, a site occupied by the atom and coordinates thereof.

The effect of this embodiment can be exhibited within the bounds of not changing the basic crystal structure of the yellow light-emitting luminescent material of this embodiment. The luminescent material according to this embodiment may have a different lattice constant and length of chemical bond of Sr—N and Sr—O (proximity atomic distance) as compared to $Sr_2Al_3Si_7ON_{13}$. If the variation is within ±15% of the lattice constant of $Sr_2Al_3Si_7ON_{13}$ and the length of chemical bond (Sr—N and Sr—O) in $Sr_2Al_3Si_7ON_{13}$, it is defined that the crystal structure does not change. The lattice constant can be determined by X-ray diffraction and neutron diffraction, and the length of chemical bond of Sr—N and Sr—O (proximity atomic distance) can be calculated from atomic coordinates.

The lattice constant of $Sr_2Al_3Si_7ON_{13}$ is a=11.8033 (13) angstroms, b=21.589 (2) angstroms, c=5.0131 (6) angstroms. The length of chemical bond (Sr—N and Sr—O) in $Sr_2Al_3Si_7ON_{13}$ can be calculated from the atomic coordinates shown in Table 1 below.

TABLE 1

| Site | Occupancy rate | x | y | z |
| --- | --- | --- | --- | --- |
| Sr1 | 4a | 1 | 0.2786 | 0.49060(11) | 0.5284(14) |
| Sr2 | 4a | 1 | 0.3552(3) | 0.69839(12) | 0.048(2) |
| Si/Al1 | 4a | 1 | 0.3582(9) | 0.2769(3) | 0.070(3) |
| Si/Al2 | 4a | 1 | 0.5782(9) | 0.7996(4) | 0.047(5) |
| Si/Al3 | 4a | 1 | 0.5563(8) | 0.4672(3) | 0.543(5) |
| Si/Al4 | 4a | 1 | 0.4724(8) | 0.6092(3) | 0.556(4) |
| Si/Al5 | 4a | 1 | 0.1910(7) | 0.6397(3) | 0.535(4) |
| Si/Al6 | 4a | 1 | 0.0061(8) | 0.5438(3) | 0.546(4) |
| Si/Al7 | 4a | 1 | 0.1625(9) | 0.5661(3) | 0.038(4) |
| Si/Al8 | 4a | 1 | 0.3937(8) | 0.3469(3) | 0.547(4) |
| Si/Al9 | 4a | 1 | 0.1552(18) | 0.3483(8) | 0.318(3) |
| Si/Al10 | 4a | 1 | 0.1525(14) | 0.3492(6) | 0.813(2) |
| O/N1 | 4a | 1 | 0.436(2) | 0.8164(10) | 0.061(11) |
| O/N2 | 4a | 1 | 0.699(2) | 0.4692(10) | 0.513(10) |
| O/N3 | 4a | 1 | 0.334(2) | 0.6355(10) | 0.511(9) |
| O/N4 | 4a | 1 | 0.213(2) | 0.2980(11) | 0.056(12) |
| O/N5 | 4a | 1 | 0.256(2) | 0.3750(10) | 0.563(9) |
| O/N6 | 4a | 1 | 0.894(2) | 0.6002(12) | 0.549(14) |
| O/N7 | 4a | 1 | 0.358(3) | 0.2062(12) | 0.893(6) |
| O/N8 | 4a | 1 | 0.508(2) | 0.4677(12) | 0.885(6) |
| O/N9 | 4a | 1 | 0.398(2) | 0.2727(12) | 0.392(6) |
| O/N10 | 4a | 1 | 0.430(3) | 0.3336(15) | 0.896(7) |
| O/N11 | 4a | 1 | 0.942(3) | 0.4814(15) | 0.371(8) |
| O/N12 | 4a | 1 | 0.662(2) | 0.8571(12) | 0.893(6) |
| O/N13 | 4a | 1 | 0.128(3) | 0.5743(15) | 0.381(7) |
| O/N14 | 4a | 1 | 0.495(3) | 0.3982(13) | 0.383(6) |

It is absolutely necessary that the yellow light-emitting luminescent material of this embodiment have the crystal structure described above. If the length of chemical bond changes beyond this range, the chemical bond is broken to form a different crystal, so that a desired effect cannot be obtained.

Figure 1B:
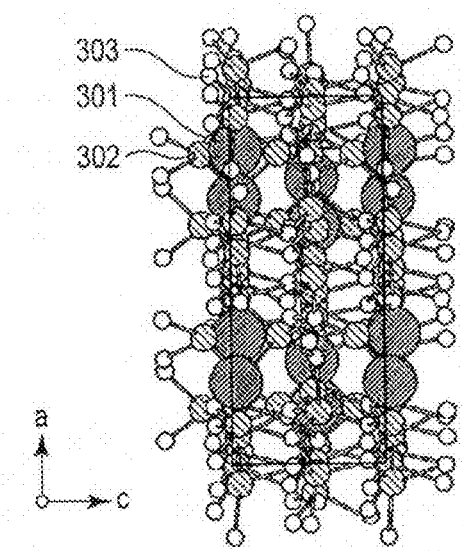
Figure 1C:
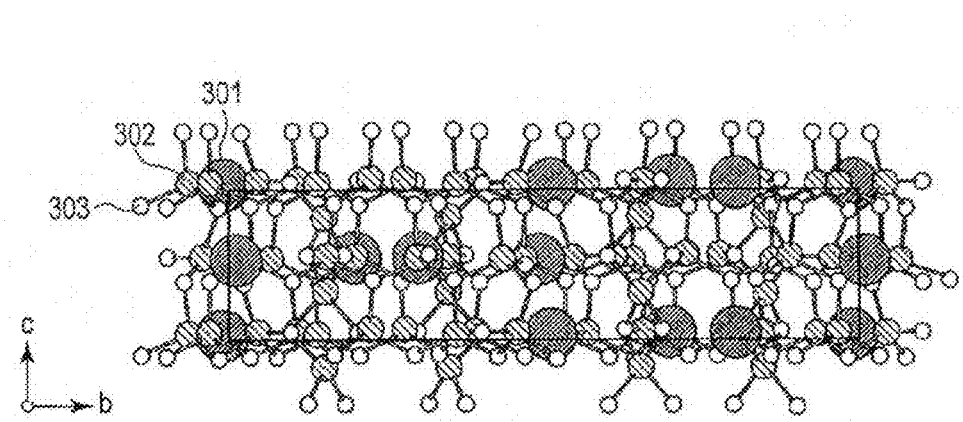

According to the atomic coordinates shown in Table 1 above, the crystal structure of $Sr_2Al_3Si_7ON_{13}$ is as shown in FIGS. 1A, 1B, and 1C. FIG. 1A is a projection view in the c axis direction, FIG. 1B is a projection view in the b axis direction, and FIG. 1C is a projection view in the a axis direction. In the figures, reference numeral 301 denotes a Sr atom, and the periphery thereof is surrounded by Si atoms or Al atoms 302 and O atoms or N atoms 303. The Sr atom 301 is partly replaced by Eu that is a luminescence center, but Eu is not shown in the figures because of its low ratio.

Figure 2:
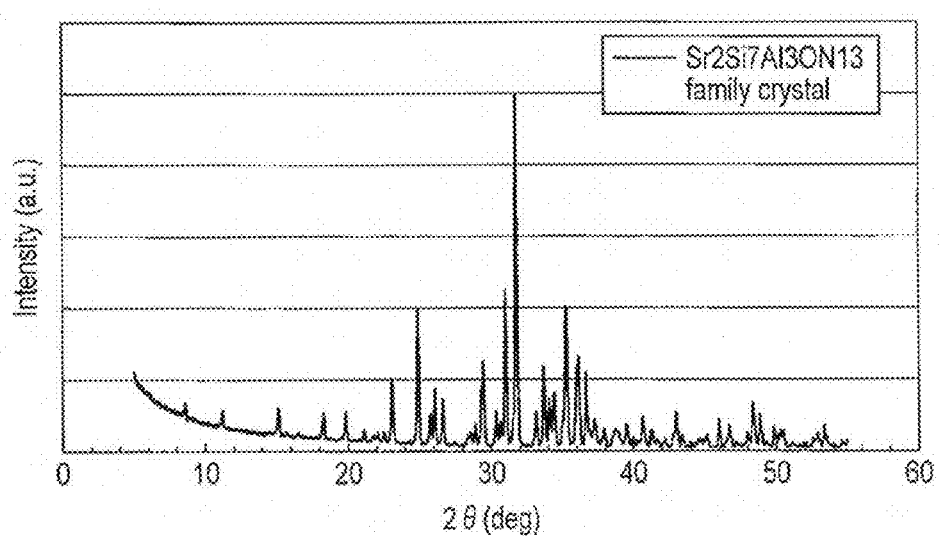
FIG. 2 is an X-ray diffraction (XRD) pattern of $Sr_2Al_3Si_7ON_{13}$.

A crystal of $Sr_2Al_3Si_7ON_{13}$ can be identified by XRD or neutron diffraction. An XRD pattern of the crystal of $Sr_2Al_3Si_7ON_{13}$ is shown in FIG. 2. The XRD pattern here is determined by X-ray diffraction by the Bragg-Brendano method using Cu—Kα line. The crystal of $Sr_2Al_3Si_7ON_{13}$ is orthorhombic, and this crystal belongs to the space group Pna 21. The space group of the crystal can be determined by single crystal XRD.

As shown in FIG. 2, in the XRD pattern of the crystal of $Sr_2Al_3Si_7ON_{13}$, diffraction peaks are observed at diffraction angles (2θ) of 8.3 to 8.8°, 11.0 to 11.4°, 14.9 to 15.4°, 18.1 to 18.6°, 19.6 to 20.1°, 22.8 to 23.3°, 24.6 to 25.1° and 31.5 to 32.0°.

As described above, the yellow light-emitting luminescent material of this embodiment is basically an inorganic compound having a crystal structure substantially same as that of $Sr_2Al_3Si_7ON_{13}$. Inorganic compounds having the same crystal structure include, for example, those having a part of Al in $Sr_2Al_3Si_7ON_{13}$ replaced by Si, those having a part of Si replaced by Al, those having a part of O replaced by N, and those having a part of N replaced by O. More specifically, $Sr_2Al_2Si_8N_{14}$, $Sr_2Al_{3.5}Si_{6.5}O_{1.5}N_{12.5}$ and the like also have a crystal structure of $Sr_2Al_3Si_7ON_{13}$. A yellow light-emitting luminescent material, which is activated by Eu and has a composition satisfying the formula 1 in the above-described crystal structure, is the yellow light-emitting luminescent material of this embodiment.

The yellow light-emitting luminescent material according to this embodiment can be manufactured by mixing raw material powders containing the elements and heating the resulting mixture.

As a Sr raw material, for example, a compound containing Sr and oxygen, such as SrO and $Sr(OH)_2$, or a Si nitride can be used. An Al raw material can be selected from, for example, nitrides and oxides of Al. For a Si raw material, for example, a Si powder or a nitride of Si can be used. As a raw material of the luminescence center element Eu, for example, an oxide or nitride of Eu can be used.

Nitrogen can be given from a nitride raw material, and oxygen can be given from an oxide raw material and a surface oxide film of a nitride raw material.

For example, a Sr raw material, an Al raw material, a Si raw material, an Al raw material and a Eu raw material are mixed in such a charge composition as to provide an intended composition. For obtaining a homogenous mixture, it is desired to mix the raw materials in a dry process in such an ascending order that a raw material powder, of which the charge amount is the smallest, is first mixed.

For example, raw material powders can be mixed using a mortar in a glove box. The mixture is placed in a crucible, and heated in a nitrogen atmosphere to obtain a luminescent material according to this embodiment. For mixing raw material powders, a ball mill method using, for example, a planetary ball mill can be employed. For allowing a reaction to proceed stably by preventing raw material from being oxidized, synthesis is carried out in a nitrogen atmosphere.

The crucible used in synthesis is preferably made of non-oxide. Preferred crucible materials specifically include boron nitride, carbon, silicon nitride, silicon carbide, aluminum nitride, sialon, molybdenum and tungsten. By using a crucible made of non-oxide, oxidization of a raw material susceptible to oxidation, such as AlN, can be prevented.

Alternatively, the luminescent material of this embodiment can be manufactured by three-stage heating described below.

In first synthesis, a Sr raw material, a Eu raw material and a Si raw material are mixed and heated to obtain an intermediate product. SrO and Sr(OH)$_2$ can be used as the Sr raw material, and an oxide of Eu can be used as the Eu raw material. A Si powder or a silicon nitride can be used as the Si raw material. For obtaining a yellow luminescence, it is required to decrease the luminous wavelength for reducing covalency of the crystal. This can be achieved by including a larger amount of O atoms in a crystal structure of $Sr_2Al_3Si_7ON_{13}$ having a part of Sr replaced by Eu. For this purpose, a compound containing Sr and oxygen is used as the Sr raw material.

The Sr raw material, the Eu raw material and the Si raw material are mixed such a charge composition as to provide an intended composition. For example, raw material powders are blended such that the molar ratio (Sr:Eu:Si) is (0.97 to 0.99:0.01 to 0.03:3.2 to 3.8). For example, raw material powders can be mixed in a dry process using a mortar in the air. A mixture containing a Sr raw material, a Eu raw material and a Si raw material, the number of moles of Eu ($M_{Eu}$) and the number of moles of Sr ($M_{Sr}$) are required to satisfy the following relationship.

$$0.01 \leq M_{Eu}/(M_{Sr}+M_{Eu}) \leq 0.16$$

If the proportion of Eu is too high, the composition represented by formula 1 cannot be achieved. On the other hand, if the proportion of Eu is too low, desired luminescence properties cannot be obtained. The ratio ($M_{Eu}/(M_{Sr}+M_{Eu})$) is preferably 0.01 to 0.03.

The mixture is placed in a crucible, and synthesized under predetermined conditions to obtain an intermediate product. The intermediate product preferably has a composition represented by (Sr, Eu)$_2$Si$_5$N$_8$. The intermediate product having such a composition is advantageous in the sense that an oxynitride luminescent material having an intended composition can be obtained.

From the reason described above, the material of a crucible used in synthesis, is a non-oxide such as boron nitride (BN), and synthesis, is carried out in a reducing atmosphere. For example, synthesis, is carried out at 1400 to 1600° C. while feeding 1.0 to 10.0 L/minute of hydrogen and 1.0 to 10.0 L/minute of nitrogen into a synthesis, reaction furnace. The pressure at synthesis, may be about 1.0 to 10.0 atm. By carrying out synthesis, for about 2.0 to 6.0 hours under these conditions, an intermediate product is obtained.

A Si raw material and an Al raw material are added to the obtained intermediate product, and mixed in a dry process. The Al raw material can be selected from aluminum oxide and aluminum nitride. As the Si raw material, the above-mentioned material can be used. For example, pigment powders are blended such that the molar ratio (Sr:Eu:Al:Si) is (0.97 to 0.99:0.01 to 0.03:1.4 to 1.6:3.2 to 3.8). The mixture is placed in a crucible, and heated in the same atmosphere as described above. From the same reason as described above, a crucible made of non-oxide is used. By carrying out heating at 1500 to 1700° C. for about 4.0 to 12.0 hours under a pressure of about 1.0 to 10.0 atm, a precursor of the yellow light-emitting luminescent material according to this embodiment is obtained.

The obtained precursor is placed in a crucible made of non-oxide, and heated at 1700 to 1900° C. for about 4.0 to 10.0 hours in a nitrogen atmosphere at 5.0 to 10.0 atm. The yellow light-emitting luminescent material according to an embodiment is thus obtained.

That is, the yellow light-emitting luminescent material according to the embodiment can be manufactured by a method including:

mixing a Sr raw material including a compound containing Sr and oxygen, a Eu raw material including a Eu oxide and a Si raw material selected from the group consisting of silicon and a silicon nitride to obtain a mixture in which the number of moles of Eu ($M_{Eu}$) and the number of moles of Sr ($M_{Sr}$) satisfy the requirement of $0.01 \leq M_{Eu}/(M_{Sr}+M_{Eu}) \leq 0.16$;

first heating including filling the mixture in a vessel made of a non-oxide material, and heating the mixture in a reducing atmosphere containing hydrogen and nitrogen to obtain an intermediate product;

second synthesis, including mixing the intermediate product, the Si raw material, and an Al raw material selected from aluminum oxide and aluminum nitride, and heating the resulting mixture in a reducing atmosphere containing hydrogen and nitrogen to obtain a precursor; and third synthesis, including heating the precursor in a nitrogen atmosphere under pressure.

Figure 3:
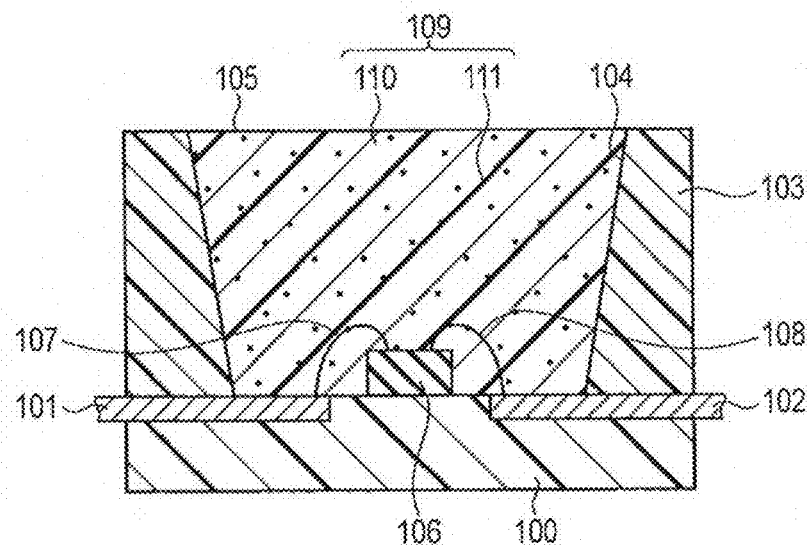
FIG. 3 is a schematic view showing a configuration of a light-emitting device according to one embodiment.

A light-emitting device according to one embodiment includes a luminous layer containing the luminescent material and a light-emitting element for exciting the luminescent material. FIG. 3 is a schematic view showing a configuration of the light-emitting device according to one embodiment.

In the light-emitting device shown in FIG. 3, leads 101 and 102 and a package cup 103 are placed on a base material 100. The base material 100 and the package cup 103 are made of resin. The package cup 103 had a recess 105 with the upper section being wider than the bottom section, and the side surface of the recess acts as a reflecting surface 104.

A light-emitting element 106 is mounted at the center of the substantially circular bottom surface of the recess 105 by an Ag paste or the like. The light-emitting element 106 that can be used emits light having an emission peak in a wavelength range of 250 to 520 nm. The light-emitting elements include, for example, light-emitting diodes and laser diodes. Specifically, the light-emitting elements include, but are not limited to, semiconductor light-emitting elements of GaN type and the like.

A p electrode and an n electrode (not shown) of the light-emitting element 106 are connected, respectively, to the lead 101 and the lead 102 by bonding wires 107 and 108 including Au and the like. The arrangement of leads 101 and 102 may appropriately be changed.

As the light-emitting element 106, a flip tip type light-emitting element having an n electrode and a p electrode on the same surface can also be used. In this case, a highly reliable semiconductor light-emitting device having a high luminance is obtained by eliminating problems caused by a wire such as breakage and detachment of the wire and absorption of light by the wire. The following configuration can also be achieved using a light-emitting element having an n-type substrate. An n electrode is formed on the back surface of the n-type substrate of the light-emitting element, and a p electrode is formed on the upper surface of a p-type semiconductor layer laminated on the substrate. The n electrode is mounted on a lead, and the p electrode is connected to the other lead by a wire.

A luminous layer 109 containing a luminescent material 110 according to one embodiment is placed in the recess 105 of the package cup 103. In the luminous layer 109, the luminescent material 110 is contained in an amount of 5 to 50% by mass in a resin layer 111 including, for example, a silicone resin. As described above, the luminescent material according to this embodiment has $Sr_2Al_3Si_7ON_{13}$ as a parent material, and this oxynitride has high covalency. Thus, the luminescent material according to this embodiment is hydrophobic, and has a very good compatibility with a resin. Therefore, scattering at an interface between the resin layer and the luminescent material is significantly suppressed to improve the light extraction efficiency.

The yellow luminescent material according to this embodiment has a good temperature property, and an excellent chromaticity, and can emit yellow light having a broad luminescence emission spectrum half width with high efficiency. By combination with a light-emitting element having an emission peak in a wavelength range of 250 to 520 nm, a white light-emitting device having excellent luminescence properties is obtained.

The size and type of the light-emitting element 106 and the dimension and shape of the recess 105 may be appropriately changed.

The light-emitting device according to one embodiment is not limited to the package cup type shown in FIG. 3, but may be appropriately changed. Specifically, even in the case of a bullet-shaped LED and a surface-mounted LED, a comparable effect can be obtained by applying the luminescent material of the embodiment.

Figure 4:
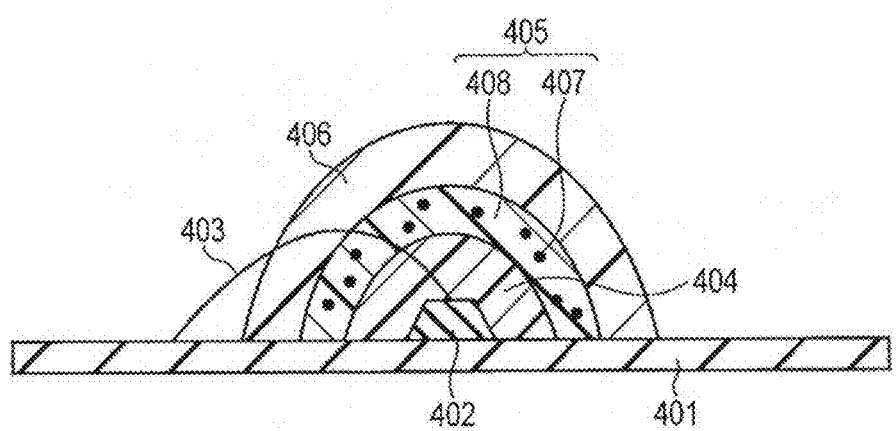
FIG. 4 is a schematic view showing a configuration of a light-emitting device according to another embodiment.

FIG. 4 shows a schematic view showing a configuration of a light-emitting device according to another embodiment. In the light-emitting device shown in the figure, an n electrode (not shown) is formed on a predetermined region of a heat-dissipative insulation substrate 401, and a light-emitting element 402 is placed thereon. The material of the heat-dissipative insulation substrate may be, for example, AlN.

One electrode in the light-emitting element 402 is placed on the bottom surface thereof, and electrically connected to an electrode of the heat-dissipative insulation substrate 401. The other electrode in the light-emitting element 401 is connected to a p electrode (not shown) on the heat-dissipative insulation substrate 401 by a gold wire 403. As the light-emitting element 402, for example, a light-emitting diode, which emits light having a wavelength of 250 to 500 nm, is used.

A dome-shaped inside transparent resin layer 404, a yellow luminous layer 405 and an outside transparent resin layer 406 are sequentially formed on the light-emitting element 402. The inside transparent resin layer 404 and the outside transparent resin layer 406 can be formed using, for example, silicone. In the yellow luminous layer 405, a yellow light-emitting luminescent material 407 is contained in a resin layer 408 including, for example, a silicone resin.

In the light-emitting device shown in FIG. 4, the yellow luminous layer 405 containing the yellow light-emitting luminescent material according to this embodiment can conveniently be prepared using a method such as dispenser coating or vacuum printing. Moreover, since the yellow luminous layer 405 is sandwiched between the inside transparent resin layer 404 and the outside transparent resin layer 406, a luminescence of the luminescent material can be inhibited from being absorbed again by a LED chip. Such an effect is obtained that the efficiency of extracting a luminescence of the luminescent material and blue light of the LED is improved to improve the luminous efficiency.

As described above, the luminescent material of this embodiment has a good temperature property, and an excellent chromaticity, and can emit yellow light having a broad luminescence emission spectrum half width with high efficiency. By combining the yellow light-emitting luminescent material of this embodiment with a light-emitting element having an emission peak in a wavelength range of 250 to 520 nm, a white light-emitting device having excellent luminescence properties can be obtained using few kinds of luminescent materials.

Specific examples of the luminescent material and light-emitting device will be described below.

Example 1

First, $Sr(OH)_2$, $Eu_2O_3$ and a Si powder were prepared as a Sr raw material, a Eu raw material and a Si raw material, and each weighed. The blending masses of $Sr(OH)_2$, $Eu_2O_3$ and Si powders were 14.31 g, 0.422 g and 6.74 g, respectively. The weighed raw material powders were mixed in a dry process in the air. The blending ratio (molar ratio) of elements in the mixture, i.e. Sr:Eu:Si, was 0.98:0.02:2.0.

The obtained mixture was filled in a boron nitride (BN) crucible, and synthesized, at 1400° C. for 8 hours in a reducing atmosphere under normal pressure at a hydrogen flow rate of 5 L/minute and a nitrogen flow rate of 5 L/minute (first synthesis). An intermediate product was obtained by the first synthesis. As a result of X-ray diffraction measurements, the composition of the intermediate product was found to be $(Sr, Eu)_2Si_5N_8$. When the intermediate product was excited by an ultraviolet ray having a wavelength of 365 nm, an orange luminescence having a peak at a wavelength of about 560 nm was shown.

The obtained intermediate product, $Si_3N_4$ and AlN were each weighed. The blending masses of the intermediate product, $Si_3N_4$ and AlN were 11.8 g, 4.49 g and 3.69 g, respectively. The weighed powders were mixed in a dry process in the air. The blending ratio (molar ratio) of elements in the mixture, i.e. Sr:Eu:Al:Si, was adjusted to be 0.98:0.02:1.5:3.6.

The obtained mixture was filled in a boron nitride (BN) crucible, and heated at 1800° C. for 8 hours in a reducing atmosphere under normal pressure at a hydrogen flow rate of 5 L/minute and a nitrogen flow rate of 5 L/minute (second synthesis). A luminescent precursor was obtained by the second synthesis.

The precursor was filled in a boron nitride (BN) crucible, and heated at 1850° C. for 8 hours in a nitrogen atmosphere under pressure at 7.5 atm (third synthesis). A luminescent material (Y1) of this Example was obtained by the third synthesis.

Figure 5:
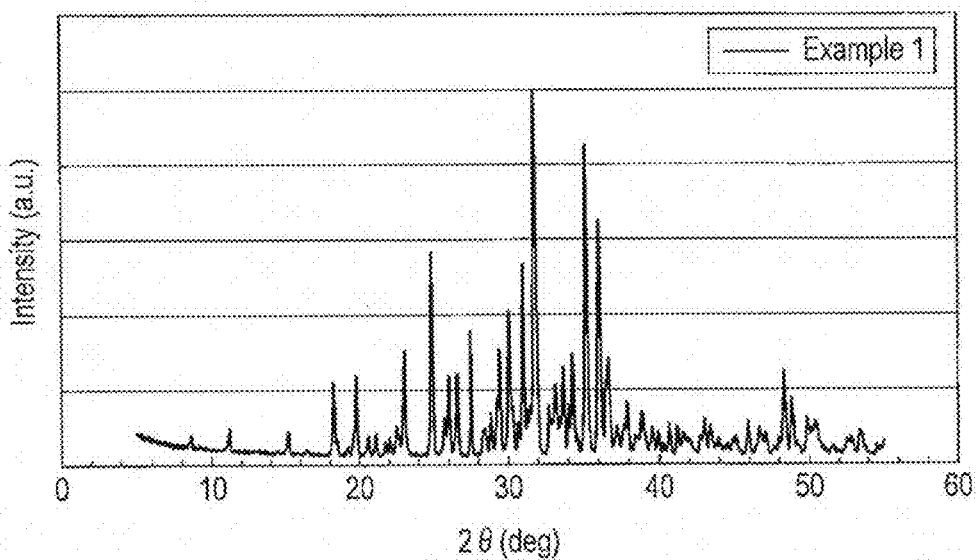
FIG. 5 is an XRD pattern of a luminescent material (Y1) of Example.

An XRD pattern of the luminescent material (Y1) is shown in FIG. 5. The XRD pattern here was determined by X-ray diffraction by the Bragg-Brendano method using Cu—Kα line. As shown in FIG. 5, peaks appear at diffraction angles (2θ) of 8.3 to 8.8°, 11.0 to 11.4°, 14.9 to 15.4°, 18.1 to 18.6°, 19.6 to 20.1°, 22.8 to 23.3°, 24.6 to 25.1° and 31.5 to 32.0°. From this result, the luminescent material (Y1) of this Example was found to have a crystal structure same as that of $Sr_2Al_3Si_7ON_{13}$.

Figure 6:
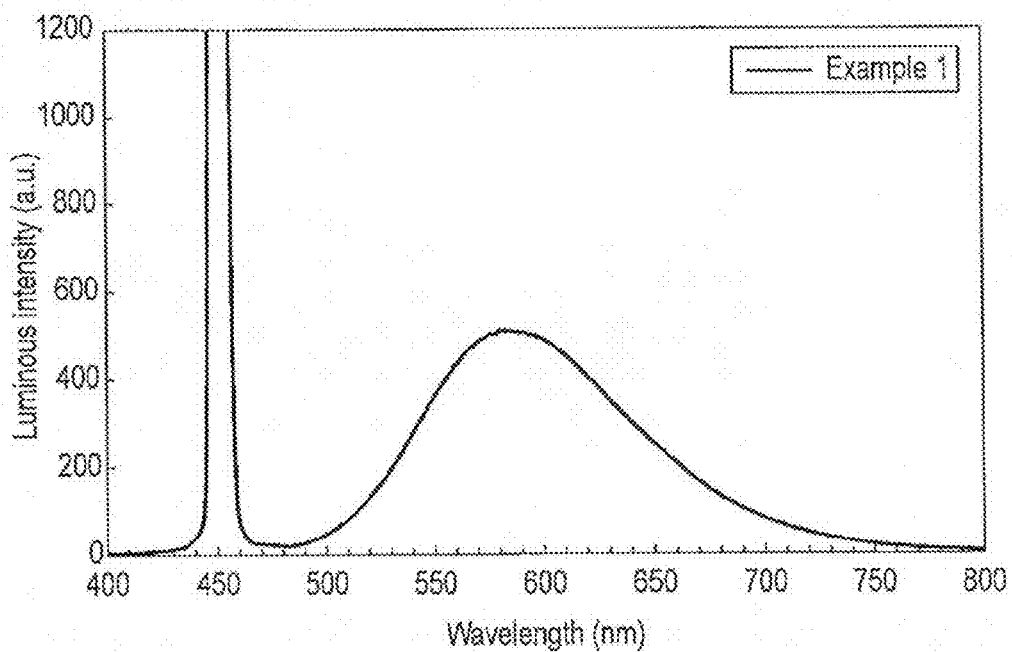
FIG. 6 is an emission spectrum when the luminescent material (Y1) of Example is excited with light having a wavelength of 450 nm.

A luminescence emission spectrum when exciting the luminescent material (Y1) with monochromatic light having a wavelength of 450 nm is shown in FIG. 6. For excitation, a luminescence obtained by monochromatization of a luminescence of a xenon lamp into light having a wavelength of 450 nm by a spectrometer was used. As shown in the figure, a high luminous efficiency was observed with a wavelength of 580 nm as a peak wavelength. The relative luminous efficiency of the luminescent material (Y1) of Example 1 obtained here is 100.

An excitation spectrum of the luminescent material (Y1) is shown in FIG. 7. The excitation spectrum here shows a wavelength of excitation light providing a luminescence having a wavelength of 580 nm when exciting the luminescent material (Y1). As shown in FIG. 7, a yellow luminescence having a wavelength of 580 nm can be obtained when exciting the luminescent material (Y1) of this Example with light having an emission peak in a wavelength range of 300 to 500 nm. The luminescent material (Y1) of this Example is excited even with light in a near-ultraviolet range of 390 to 410 nm to obtain a yellow luminescence. This aspect is advantageous in the sense that a high color rendering white LED for near-ultraviolet light excitation can be prepared.

A light-emitting device having the configuration shown in FIG. 4 was prepared using the luminescent material (Y1) of this Example.

As a heat-dissipative insulation substrate 401, an AlN substrate of 8 mm square having a p electrode and an n electrode (not shown) on a predetermined region was prepared. A light-emitting diode having an emission peak wavelength of 455 nm was jointed onto the AlN substrate as a light-emitting element 402 by solder. One electrode in the light-emitting element 402 was provided on the bottom surface thereof, and electrically connected to the n electrode of the AlN substrate 401. The other electrode in the light-emitting element 402 was connected to the p electrode (not shown) on the AlN substrate 401 by a gold wire 403.

An inside transparent resin layer 404, a yellow luminous layer 405 and an outside transparent resin layer 406 were sequentially formed in a dome shape on the light-emitting element 402 to prepare a light-emitting device of this Example. The material of the inside transparent resin layer 404 was a transparent silicone resin, the layer was formed by dispenser coating, followed by dry-curing. For formation of the yellow luminous layer 405, a transparent resin containing the luminescent material (Y1) of this Example in an amount of 30% by mass was used. The transparent resin used is silicone. Further, for formation of the outside transparent resin layer 406 on the yellow luminous layer 405, dispenser coating, followed by dry-curing was used as in the case of the inside transparent resin layer 404.

When the light-emitting device was placed in an integrating sphere and driven at 20 mA and 3.1 V, the chromaticity was (0.35, 0.31), the color temperature was 5000 K, the luminous flux efficiency was 80 lm/W and Ra was 82. The chromaticity, color temperature, luminous flux efficiency and Ra were obtained from an integrating sphere type total luminous flux measurement apparatus.

A luminescence emission spectrum of the obtained light-emitting device is shown in FIG. 8. By combining the luminescent material (Y1) of this Example with a blue LED having a wavelength of 455 nm, a white light-emitting device of this embodiment was obtained. The white light-emitting device is advantageous in the sense that a light-emitting device having an Ra of 80 or greater can be achieved with only a blue LED and yellow luminescent material.

Example 2

First, $Sr(OH)_2$, $Eu_2O_3$ and a Si powder were prepared as a Sr raw material, a Eu raw material and a Si raw material, and each weighed. The blending masses of $Sr(OH)_2$, $Eu_2O_3$ and Si powders were 36.13 g, 0.528 g and 16.85 g, respectively. The weighed raw materials were mixed in a dry process as in the case described above. The blending ratio (molar ratio) of elements contained in the raw material, i.e. Sr:Eu:Si, was 0.99:0.01:2.0.

The obtained mixture was filled in a boron nitride (BN) crucible, and synthesized at 1400° C. for 8 hours in a reducing atmosphere under normal pressure at a hydrogen flow rate of 5 L/minute and a nitrogen flow rate of 5 L/minute (first synthesis). An intermediate product was obtained by the first synthesis). When the intermediate product was excited with an ultraviolet ray having a wavelength of 365 nm, an orange luminescence having a peak at a wavelength of about 560 nm was observed.

The obtained intermediate product, $Si_3N_4$ and AlN were each weighed. The blending masses of the intermediate product, $Si_3N_4$ and AlN were 11.8 g, 4.49 g and 3.69 g, respectively. The weighed powders were mixed in a dry process as in the case described above. The blending ratio (molar ratio) of elements in the mixture, i.e. Sr:Eu:Al:Si, was adjusted to be 0.99:0.01:1.5:3.6.

The obtained mixture was filled in a boron nitride (BN) crucible, and heated at 1600° C. for 8 hours in a reducing atmosphere under normal pressure at a hydrogen flow rate of 5 L/minute and a nitrogen flow rate of 5 L/minute (second synthesis). A luminescent material precursor was obtained by the second synthesis.

The precursor was filled in a boron nitride (BN) crucible, and synthesized at 1850° C. for 8 hours in a nitrogen atmosphere under pressure of 7.5 atm (third synthesis). A luminescent material (Y2) of this Example was obtained by the third synthesis.

An XRD pattern of the luminescent material (Y2) is shown in FIG. 9. The XRD pattern was obtained by the same method as described above. As shown in FIG. 9, peaks appear at diffraction angles (2θ) of 8.3 to 8.8°, 11.0 to 11.4°, 14.9 to 15.4°, 18.1 to 18.6°, 19.6 to 20.1°, 22.8 to 23.3°, 24.6 to 25.1° and 31.5 to 32.0°. From this result, the luminescent material (Y2) of this Example was found to have a crystal structure same as that of $Sr_2Al_3Si_7ON_{13}$.

A luminescence emission spectrum when exciting the luminescent material (Y2) with monochromatic light having a wavelength of 450 nm is shown in FIG. 10. The light-emitting element used for excitation is same as that described above. As shown in the figure, a high luminous efficiency was observed with a wavelength of 571 nm as a peak wavelength. The relative luminous efficiency of the luminescent material (Y2) of this Example is 72.

Figure 11:
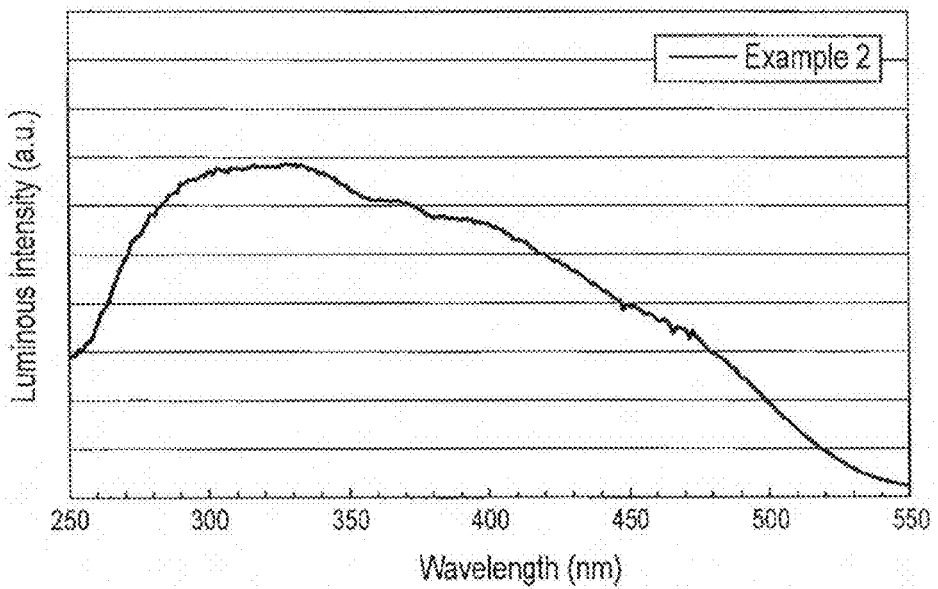
FIG. 11 is an excitation spectrum of the luminescent material (Y2) of Example.

An excitation spectrum of the luminescent material (Y2) is shown in FIG. 11. The excitation spectrum here shows a wavelength of excitation light providing a luminescence having a wavelength of 571 nm when exciting the luminescent material (Y2). As shown in FIG. 11, a yellow luminescence having a wavelength of 571 nm can be obtained when exciting the luminescent material (Y2) of this Example with light having an emission peak in a wavelength range of 300 to 480 nm. As in the case of the luminescent material described above, the luminescent material (Y2) of this Example is excited even with light in a near-ultraviolet range of 390 to 410 nm to obtain a yellow luminescence, and is therefore advantageous in the sense that a high color rendering white LED for near-ultraviolet light excitation can be prepared.

A white light-emitting device was prepared in the same manner as described above except that the luminescent material (Y2) of this Example was used. The obtained white light-emitting device was found to have a high luminous efficiency and a good Ra as in the case described above.

Example 3

First, $Sr(OH)_2$, $Eu_2O_3$ and Si powders were prepared as a Sr raw material, a Eu raw material and a Si raw material, and each weighed. The blending masses of $Sr(OH)_2$, $Eu_2O_3$ and Si powders were 36.13 g, 0.528 g and 16.85 g, respectively. The weighed raw materials were mixed in a dry process as in the case described above. The blending ratio (molar ratio) of elements contained in the raw material, i.e. Sr:Eu:Si, was 0.99:0.01:2.0.

The obtained mixture was filled in a boron nitride (BN) crucible, and heated at 1400° C. for 8 hours in a reducing atmosphere under normal pressure at a hydrogen flow rate of 5 L/minute and a nitrogen flow rate of 5 L/minute (first synthesis). An intermediate product was obtained by the first synthesis. When the intermediate product was excited with an ultraviolet ray having a wavelength of 365 nm, an orange luminescence having a peak at a wavelength of about 560 nm was observed.

The obtained intermediate product, $Si_3N_4$ and AlN were each weighed. The blending masses of the intermediate product, $Si_3N_4$ and AlN were 11.8 g, 4.49 g and 3.69 g, respectively. The weighed powders were mixed in a dry process as in the case described above. The blending ratio (molar ratio) of elements in the mixture, i.e. Sr:Eu:Al:Si, was adjusted to be 0.99:0.01:1.5:3.6.

The obtained mixture was filled in a boron nitride (BN) crucible, and heated at 1600° C. for 8 hours in a reducing atmosphere under normal pressure at a hydrogen flow rate of 5 L/minute and a nitrogen flow rate of 5 L/minute (second synthesis). A luminescent material precursor was obtained by the second synthesis.

The precursor was filled in a boron nitride (BN) crucible, and heated at 1800° C. for 8 hours in a nitrogen atmosphere under pressure of 7.5 atm (third synthesis). A luminescent material (Y3) of this Example was obtained by the third synthesis.

Figure 12:
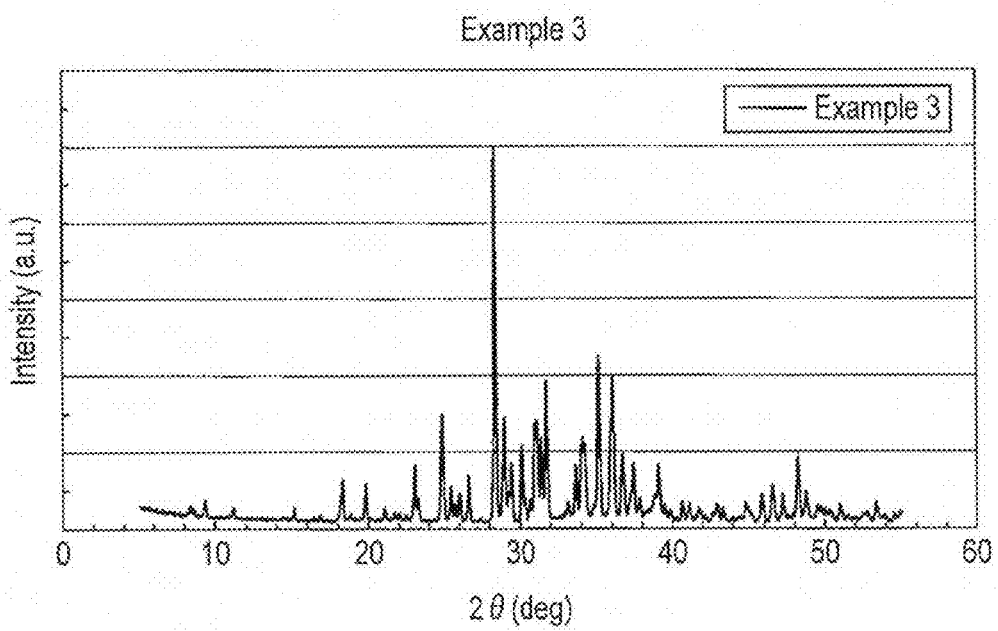
FIG. 12 is an XRD pattern of a luminescent material (Y3) of Example.

An XRD pattern of the luminescent material (Y3) is shown in FIG. 12. The XRD pattern was obtained by the same method as described above. As shown in FIG. 12, peaks appear at diffraction angles (2θ) of 8.3 to 8.8°, 11.0 to 11.4°, 14.9 to 15.4°, 18.1 to 18.6°, 19.6 to 20.1°, 22.8 to 23.3°, 24.6 to 25.1° and 31.5 to 32.0°. From this result, the luminescent material (Y3) of this Example was found to have a crystal structure same as that of $Sr_2Al_3Si_7ON_{13}$.

A luminescence emission spectrum when exciting the luminescent material (Y3) with monochromatic light having a wavelength of 450 nm is shown in FIG. 13. The light-emitting element used for excitation is same as that described above. As shown in the figure, a high luminous efficiency was observed with a wavelength of 574 nm as a peak wavelength. The relative luminous efficiency of the luminescent material (Y3) of this Example is 83.

An excitation spectrum of the luminescent material (Y3) is shown in FIG. 14. The excitation spectrum here shows a wavelength of excitation light providing a luminescence having a wavelength of 574 nm when exciting the luminescent material (Y3). As shown in FIG. 14, a yellow luminescence having a wavelength of 574 nm can be obtained when exciting the luminescent material (Y3) of this Example with light having an emission peak in a wavelength range of 350 to 480 nm. As in the case of the luminescent material described above, the luminescent material (Y3) of this Example is excited even with light in a near-ultraviolet range of 390 to 410 nm to obtain a yellow luminescence, and is therefore advantageous in the sense that a high color rendering white LED for near-ultraviolet light excitation can be prepared.

A white light-emitting device was prepared in the same manner as described above except that the luminescent material (Y3) of this Example was used. The obtained white light-emitting device was found to have a high luminous efficiency and a good Ra as in the case described above.

Example 4

First, $Sr_3N_2$, EuN, $Si_3N_4$, $Al_2O_3$ and AlN were prepared as a Sr raw material, a Eu raw material, a Si raw material and an Al raw material, and each weighed in a vacuum glove box. The blending masses of $Sr_3N_2$, EuN, $Si_3N_4$, $Al_2O_3$ and AlN were 2.851 g, 0.100 g, 4.911 g, 1.025 g and 1.025 g, respectively. The weighed raw materials were mixed in a dry process in an agate mortar.

The obtained mixture was filled in a boron nitride (BN) crucible, and heated at 1850° C. for 4 hours in a $N_2$ atmosphere at 7.5 atm to obtain a luminescent material (Y4) of this Example. The design composition of the obtained luminescent material is $(Sr_{0.98}Eu_{0.02})_2Al_{13}Si_7O_2N_{12}$.

Figure 15:
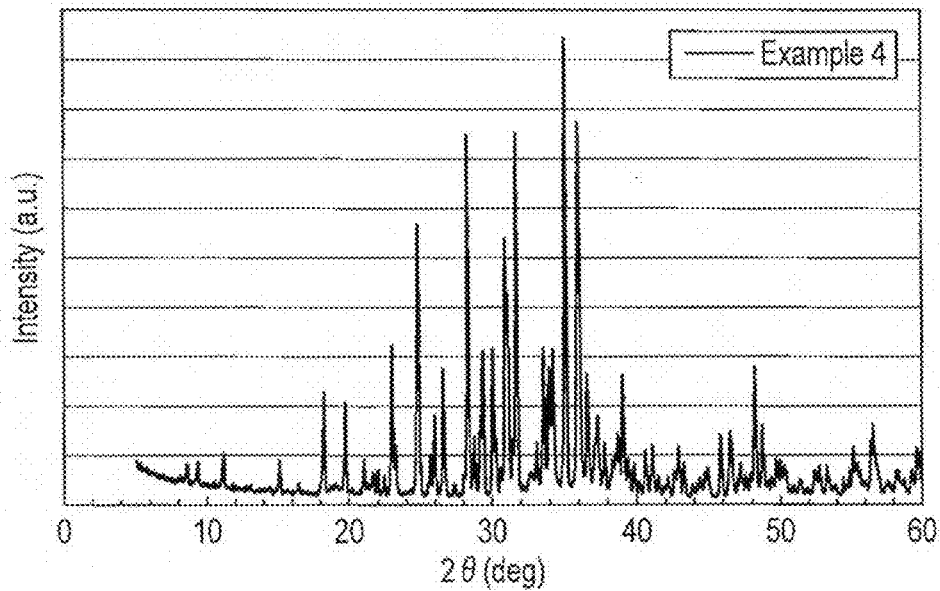
FIG. 15 is an XRD pattern of a luminescent material (Y4) of Example.

An XRD pattern of the luminescent material (Y4) is shown in FIG. 15. The XRD pattern was obtained by the same method as described above. As shown in FIG. 15, peaks appear at diffraction angles (2θ) of 8.3 to 8.8°, 11.0 to 11.4°, 14.9 to 15.4°, 18.1 to 18.6°, 19.6 to 20.1°, 22.8 to 23.3°, 24.6 to 25.1° and 31.5 to 32.0°. From this result, the luminescent material (Y4) of this Example was found to have a crystal structure same as that of $Sr_2Al_3Si_7ON_{13}$.

Figure 16:
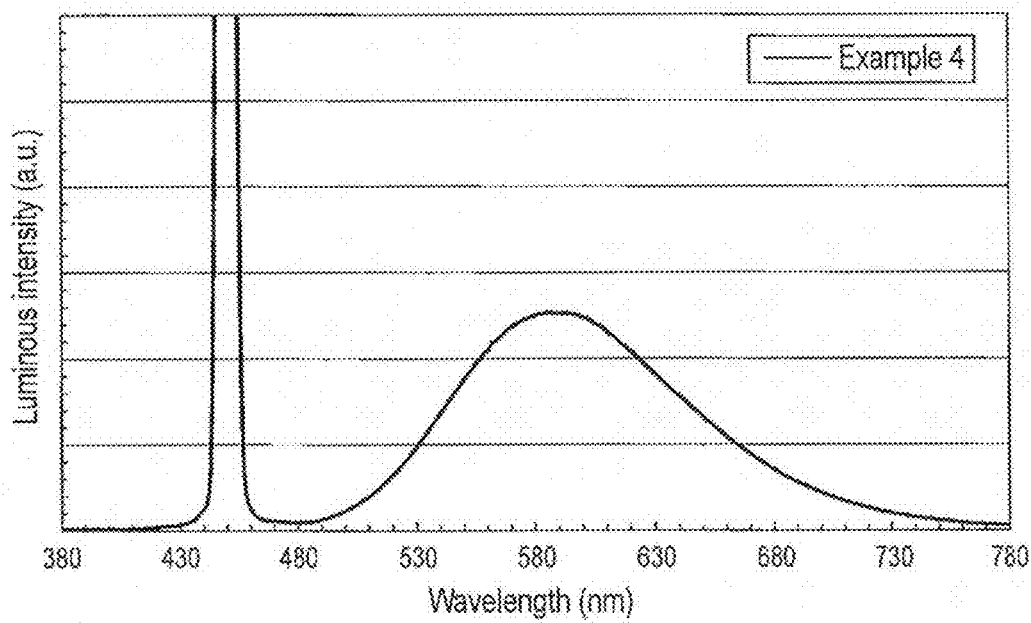
FIG. 16 is a luminescence emission spectrum when the luminescent material (Y4) of Example is excited with light having a wavelength of 450 nm.

When the luminescent material (Y4) of this Example was excited with black light, an orange luminescence was observed. A luminescence emission spectrum when exciting the luminescent material (Y4) with monochromatic light having a wavelength of 450 nm is shown in FIG. 16. The light-emitting element used for excitation is same as that described above. As shown in the figure, a high luminous efficiency was observed with a wavelength of 588 nm as a peak wavelength. The relative luminous efficiency of the luminescent material (Y4) of this Example is 98.

An excitation spectrum of the luminescent material (Y4) is shown in FIG. 17. The excitation spectrum here shows a wavelength of excitation light providing a luminescence having a wavelength of 588 nm when exciting the luminescent material (Y4). As shown in FIG. 17, a yellow luminescence having a wavelength of 588 nm can be obtained when exciting the luminescent material (Y4) of this Example with light having an emission peak in a wavelength range of 300 to 500 nm. As in the case of the luminescent material described above, the luminescent material (Y4) of this Example is excited even with light in a near-ultraviolet range of 390 to 410 nm to obtain a yellow luminescence, and is therefore advantageous in the sense that a high color rendering white LED for near-ultraviolet light excitation can be prepared.

A white light-emitting device was prepared in the same manner as described above except that the luminescent material (Y4) of this Example was used. The obtained white light-emitting device was found to have a high luminous efficiency and a good Ra as in the case described above.

Examples 5 to 13

Luminescent materials (Y5 to Y13) of Examples 5 to 13 were synthesized by the same method as that in Example 1 except that the blending masses of raw materials were appropriately changed.

When XRD patterns of luminescent materials (Y5 to Y13) were determined in the same manner as described above, peaks appear at diffraction angles (2θ) of 8.3 to 8.8°, 11.0 to 11.4°, 14.9 to 15.4°, 18.1 to 18.6°, 19.6 to 20.1°, 22.8 to 23.3°, 24.6 to 25.1° and 31.5 to 32.0° for all the luminescent materials. From this result, the luminescent materials (Y5 to Y13) of Examples 5 to 13 were found to have a crystal structure same as that of $Sr_2Al_3Si_7ON_{13}$.

When light having a wavelength of 450 nm was radiated using a light-emitting element same as that described above to excite luminescent materials (Y5 to Y13) of Examples 5 to 13, a luminescence having a peak in a wavelength range of 570 to 590 nm was observed from each of the luminescent materials. The relative luminous efficiency of each of luminescent materials (Y5 to Y13) was 67 to 97.

As a result of determining the excitation spectra of luminescent materials (Y5 to Y13), a yellow luminescence having a wavelength of 570 to 590 nm could be obtained for all the luminescent materials when they were excited with light having an emission peak in a wavelength range of 300 to 500 nm. As in the case of the luminescent material described above, luminescent materials (Y5 to Y13) are excited even with light in a near-ultraviolet range of 390 to 410 nm, and is therefore advantageous in the sense that a high color rendering white LED for near-ultraviolet light excitation can be prepared.

White light-emitting devices were prepared in the same manner as described above except that luminescent materials (Y5 to Y13) were used. Obtained white light emitting devices were each found to have a high luminous efficiency and a good Ra as in the case described above.

The results of chemical analyses performed by inductively coupled plasma (ICP) for luminescent materials (Y1 to Y13) of Examples 1 to 13 are summarized in Table 2 below. Values shown in Table 2 are molar ratios with the concentrations of analyzed elements normalized by the Al concentration.

TABLE 2

|  | Sr | Eu (x) | Sr + Eu (a) | Al | Si (b) | O (c) | N (d) | N/O (d/c) |
|---|---|---|---|---|---|---|---|---|
| Example 1 | 0.605 | 0.013 | 0.619 | 1.000 | 2.348 | 0.777 | 4.196 | 5.402 |
| Example 2 | 0.613 | 0.007 | 0.619 | 1.000 | 2.339 | 0.759 | 4.196 | 5.529 |
| Example 3 | 0.595 | 0.007 | 0.601 | 1.000 | 2.270 | 0.722 | 4.087 | 5.663 |
| Example 4 | 0.632 | 0.015 | 0.647 | 1.000 | 2.083 | 0.525 | 4.083 | 7.778 |
| Example 5 | 0.526 | 0.006 | 0.520 | 1.000 | 2.340 | 0.777 | 4.140 | 5.328 |
| Example 6 | 0.557 | 0.062 | 0.619 | 1.000 | 2.348 | 0.777 | 4.196 | 5.402 |
| Example 7 | 0.566 | 0.006 | 0.560 | 1.000 | 2.340 | 0.777 | 4.140 | 5.328 |
| Example 8 | 0.632 | 0.015 | 0.647 | 1.000 | 2.250 | 0.750 | 4.083 | 5.444 |
| Example 9 | 0.605 | 0.013 | 0.619 | 1.000 | 2.100 | 0.733 | 3.900 | 5.321 |
| Example 10 | 0.637 | 0.013 | 0.650 | 1.000 | 2.45 | 0.790 | 4.33 | 5.481 |
| Example 11 | 0.595 | 0.003 | 0.601 | 1.000 | 2.270 | 0.700 | 4.217 | 6.024 |
| Example 12 | 0.605 | 0.013 | 0.619 | 1.000 | 2.348 | 0.910 | 4.010 | 4.407 |
| Example 13 | 0.595 | 0.007 | 0.601 | 1.000 | 2.270 | 1.040 | 3.910 | 3.760 | x, a, b, c and d in Table 2 above correspond to x, a, b, c and d in formula 1. As shown in Table 2 above, x, a, b, c and d fall within the range shown below for all of luminescent materials (Y1 to Y13) of Examples 1 to 13.

$0 < x \leq 0.16, 0.50 \leq a \leq 0.70, 2.0 \leq b \leq 2.5$ $0.45 \leq c \leq 1.2, 3.5 \leq d \leq 4.5, 3.6 \leq d/c \leq 8.0$.

Comparative Example 1

α sialon was prepared as Comparative Example 1. 23.8 g of $Si_3N_4$, 14.3 g of AlN, 8.9 g of $CaCO_3$ and 3.2 g of $Eu_2O_3$, which were used as raw materials, were mixed using a mortar in the air, the resulting mixture was filled in a crucible made of boron nitride, and synthesized at 1700° C. for 24 hours under pressure of 7.5 atm in a nitrogen atmosphere, and the obtained sintered body was ground using a mortar to prepare a sialon. The α sialon here is represented by $M_x(Si_{12-(m+n)}Al_{m+n}(O_nN_{16-n}))$ (where M is Ca, m is 3.25 and n is 1.625).

Comparative Examples 2 to 8

Luminescent materials (C2 to C8) of Comparative Examples 2 to 8 were synthesized by a method same as that in Example 1 except that the blending masses of raw materials were appropriately changed.

XRD patterns of luminescent materials (C1 to C8) of Comparative Examples were determined in the same manner as described above. As a result, peaks do not always appear at diffraction angles (2θ) of 8.3 to 8.8°, 11.0 to 11.4°, 14.9 to 15.4°, 18.1 to 18.6°, 19.6 to 20.1°, 22.8 to 23.3°, 24.6 to 25.1° and 31.5 to 32.0°.

When light having a wavelength of 450 nm was radiated using a light-emitting element same as that described above to excite luminescent materials (C1 to C8), a luminescence having a peak in a wavelength range of 550 to 590 nm was not observed from any of luminescent materials.

Results of chemical analyses performed by inductively coupled plasma (ICP) for luminescent materials (C1 to C8) of Comparative Examples 1 to 8 are summarized in Table 3 below. Values shown in Table 3 are molar ratios with the concentrations of analyzed elements normalized by the Al concentration.

TABLE 3

|  | Sr | Eu (x) | Sr + Eu (a) | Al | Si (b) | O (c) | N (d) | N/O (d/c) |
|---|---|---|---|---|---|---|---|---|
| Comparative Example 1[*] | 0.256 (Ca) | 0.05 | 0.301 (Ca + Eu) | 1.000 | 1.462 | 0.333 | 3.051 | 9.162 |
| Comparative Example 2 | 0.433 | 0.186 | 0.619 | 1.000 | 2.083 | 0.525 | 4.083 | 7.778 |
| Comparative Example 3 | 0.373 | 0.246 | 0.619 | 1.000 | 2.348 | 0.777 | 4.196 | 5.402 |
| Comparative Example 4 | 0.480 | 0.010 | 0.490 | 1.000 | 2.340 | 0.777 | 4.140 | 5.328 |
| Comparative Example 5 | 0.14 | 0.57 | 0.71 | 1.00 | 2.35 | 0.51 | 4.25 | 8.333 |
| Comparative Example 6 | 0.595 | 0.007 | 0.601 | 1.000 | 1.500 | 0.432 | 3.330 | 7.708 |
| Comparative Example 7 | 0.64 | 0.07 | 0.71 | 1.00 | 2.63 | 0.21 | 4.72 | 22.476 |
| Comparative Example 8 | 0.930 | 0.100 | 1.030 | 1.000 | 4.312 | 1.261 | 6.734 | 5.341 |

[*] Not Sr but Ca in this case.

x, a, b, c and d in Table 3 above correspond to x, a, b, c and d in formula 1. As shown in Table 3 above, for luminescent materials (C1 to C8) of Comparative Examples 1 to 8, x, a, b, c and d fall out of the range shown below. The analysis value of Ca is described in the column for the analysis value of Sr for the luminescent material (C1) of Comparative Example 1 in Table 3 above.

$0 < x \leq 0.16, 0.50 \leq a \leq 0.70, 2.0 \leq b \leq 2.5$ $0.45 \leq c \leq 1.2, 3.5 \leq d \leq 4.5, 3.6 \leq d/c \leq 8.0$.

The luminescence peak wavelengths, luminescence properties and temperature properties of luminescent materials (Y1 to Y13) of Examples 1 to 13 and luminescent materials (C1 to C8) of Comparative Examples 1 to 8 are summarized in Tables 4 and 5 below.

TABLE 4

| | Wavelength (nm) | Half width (nm) | Luminous efficiency (%) | Luminous efficiency (relative value) | Chromaticity Cx | Cy | Temperature property (@150° C.) |
|---|---|---|---|---|---|---|---|
| Example 1 | 580 | 112 | 60 | 100 | 0.502 | 0.486 | 0.86 |
| Example 2 | 571 | 113 | 43 | 72 | 0.465 | 0.513 | 0.87 |
| Example 3 | 574 | 111 | 50 | 83 | 0.473 | 0.507 | 0.86 |
| Example 4 | 588 | 114 | 59 | 98 | 0.509 | 0.480 | 0.82 |
| Example 5 | 571 | 113 | 40 | 67 | 0.465 | 0.513 | 0.87 |
| Example 6 | 590 | 110 | 55 | 92 | 0.574 | 0.423 | 0.80 |
| Example 7 | 576 | 111 | 48 | 80 | 0.474 | 0.506 | 0.86 |
| Example 8 | 578 | 112 | 58 | 97 | 0.501 | 0.487 | 0.86 |
| Example 9 | 570 | 113 | 48 | 80 | 0.464 | 0.514 | 0.87 |
| Example 10 | 580 | 112 | 58 | 97 | 0.502 | 0.488 | 0.86 |
| Example 11 | 570 | 112 | 45 | 75 | 0.465 | 0.513 | 0.87 |
| Example 12 | 571 | 113 | 44 | 73 | 0.464 | 0.514 | 0.87 |
| Example 13 | 570 | 114 | 42 | 70 | 0.464 | 0.514 | 0.86 |

TABLE 5

| | Wavelength (nm) | Half width (nm) | Luminous efficiency (%) | Luminous efficiency (relative value) | Chromaticity Cx | Cy | Temperature property (@150° C.) |
|---|---|---|---|---|---|---|---|
| Comparative Example 1 | 595 | 90 | 57 | 95 | 0.540 | 0.457 | 0.90 |
| Comparative Example 2 | 610 | 107 | 50 | 83 | 0.555 | 0.432 | 0.63 |
| Comparative Example 3 | 616 | 106 | 45 | 75 | 0.543 | 0.435 | 0.60 |
| Comparative Example 4 | Heterogeneous phase generation | — | — | — | — | — | — |
| Comparative Example 5 | 635 | 110 | 31 | 51 | 0.619 | 0.380 | 0.44 |
| Comparative Example 6 | Heterogeneous phase generation | — | — | — | — | — | — |
| Comparative Example 7 | 640 | 110 | 48 | 80 | 0.633 | 0.366 | 0.70 |
| Comparative Example 8 | Heterogeneous phase generation | — | — | — | — | — | — |

The luminescence peak wavelength was read from a luminescence emission spectrum when exciting the luminescent material with light having a wavelength of 450 nm, and the half width was read from the luminescence emission spectrum. The luminous efficiency was determined by a quantum efficiency measurement apparatus. The relative value calculated based on the luminous efficiency of the luminescent material of Example 1 is also described.

The chromaticity was determined in the same manner as described above, and the temperature property was determined in the following manner. A luminescent material was placed on a heater built-in stage, and heated to obtain a peak intensity at 150° C. ($I_{150}$). The temperature property was calculated from ($I_{150}/I_{RT}$) using a peak intensity ($I_{RT}$) at room temperature.

As shown in Table 4 above, luminescent materials (Y1 to Y13) of Examples 1 to 13 each emit light having a peak in a wavelength range of 570 to 590 nm, and have a half wide of 110 nm or greater. The half width is an index for a color rendering property, and is required to be 110 nm or greater. Luminescent materials of examples each have a half width of 110 nm or greater, and is therefore shown to have an excellent color rendering property when formed into a white LED. Luminescent materials of Examples 1 to 13 have a good luminous efficiency and chromaticity, and an excellent temperature property of 0.80 or greater. If the temperature property is 0.80 or greater, desired properties can be retained even at a high temperature.

In contrast, luminescent materials (C1 to C8) of Comparative Examples 1 to 6 cannot satisfy all desired properties. In the case of α sialon (Comparative Example 1), the half width is no more than 90 nm and the color rendering property is poor.

In the case where the value of x in formula 1 is greater than 0.16 and Eu is excessively contained (Comparative Examples 2 and 3), the peak wavelength of light emitted exceeds 610 nm. Thus, light having a peak in a wavelength range of 550 to 590 nm cannot be emitted if the value of x in formula 1 is too high.

In the case where the value of a in formula 1 is less than 0.5 (Comparative Example 4), the amount of Sr+Eu in the composition is too low. In this case, generation of a different crystal phase was observed by fluorescence microscopy. Moreover, the luminescent material of Comparative Example 4 had such a low luminous intensity that the luminescence property could not measured. On the other hand, in the case where the value of a is greater than 0.7 (Comparative Example 5), the amount of Sr+Eu in the composition is too high to emit light having a peak in a wavelength range of 550 to 590 nm.

In the case where the values of b and c in formula 1 are too low and the amounts of Si and O are low (Comparative Example 6), generation of a different crystal phase was observed by fluorescence microscopy. Moreover, the luminescent material of Comparative Example 6 had such a low luminous intensity that the luminescence property could not be measured. The same applied to the case of Comparative Example 8 where the value of a in formula 1 is too low and the values of b, c and d are too high. Generation of a different crystal phase was observed by fluorescence microscopy, and the luminous intensity was so low that the luminescence property could not be measured.

In the case where the N/O ratio is greater than 8.0 (Comparative Example 7), light having a peak in a wavelength range of 550 to 590 nm cannot be emitted. It is one of causes thereof that if the N/O ratio increases, a decline in the energy level of the 4f orbital due to the Nephelauxetic effect and crystal field splitting becomes significant as the nitrogen ratio in a parent material increases because nitrogen has covalency higher than that of oxygen, and thus a difference in the energy level between 4f and 5d orbitals decreases, resulting in an increase in the wavelength.

According to embodiments of the present invention, there is provided a luminescent material which has a good temperature property and an excellent chromaticity, and can emit yellow light having a broad luminescence emission spectrum half width with high efficiency. When the yellow light-emitting luminescent material of this embodiment is combined with a blue LED, a white light-emitting device having a good luminescence property can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A luminescent material which emits light having a luminescence peak within a wavelength range of 550 to 590 nm when excited with light having an emission peak in a wavelength range of 250 to 520 nm, the luminescent material having a composition represented by the following formula 1:

$(Sr_{1-x}Eu_x)_a Si_b AlO_c N_d$     formula 1 wherein x, a, b, c and d satisfy following condition:

0<x≤0.16, 0.50≤a≤0.70, 2.0≤b≤2.5

0.45≤c≤1.2, 3.5≤d≤4.5, and 3.6≤d/c≤8.0.

2. The luminescent material according to claim 1, wherein the luminescent material has luminescence peaks at diffraction angles (2θ) of 8.3 to 8.8°, 11.0 to 11.4°, 14.9 to 15.4°, 18.1 to 18.6°, 19.6 to 20.1°, 22.8 to 23.3°, 24.6 to 25.1° and 31.5 to 32.0° in X-ray diffraction by the Bragg-Brendano method using Cu—Kα line.

3. The luminescent material according to claim 2, wherein the luminescent material has orthorhombic crystal structure.

4. The luminescent material according to claim 1, wherein x is 0.01 to 0.10.

5. The luminescent material according to claim 1, wherein a is 0.55 to 0.65.

6. The luminescent material according to claim 1, wherein b is 2.1 to 2.3.

7. The luminescent material according to claim 1, wherein c is 0.7 to 1.1.

8. The luminescent material according to claim 1, wherein d is 3.9 to 4.2.

9. The luminescent material according to claim 1, wherein (d/c) is 3.7 to 6.0.

10. The luminescent material according to claim 1, wherein 15 at % or less of Sr is replaced with another element.

11. The luminescent material according to claim 10, wherein another element is selected from the group consisting of Ba, Ca and Mg.

12. A light-emitting device comprising:
a light-emitting element which emits light having an emission peak in a wavelength range of 250 to 500 nm; and
a luminous layer comprising a luminescent material which receives light from the light-emitting element and emits yellow light, the luminescent material which emits yellow light comprising the luminescent material of claim 1.

13. The light-emitting device according to claim 12, further comprising:
a heat-dissipative insulation substrate on which the light-emitting element is placed,
wherein the luminous layer is dome-shaped.

14. The light-emitting device according to claim 13, further comprising:
an inside transparent resin layer placed inside the luminous layer, and
an outside transparent resin layer placed outside the luminous layer.

15. A method for manufacturing a luminescent material of claim 1, comprising:
mixing a Sr raw material comprising a compound comprising Sr and oxygen, a Eu raw material comprising an Eu oxide, and a Si raw material selected from the group consisting of silicon and a silicon nitride to obtain a mixture satisfying a relationship of $0.01 \leq M_{Eu}/(M_{Sr}+M_{Eu}) \leq 0.16$, where $M_{Eu}$ is a number of moles of Eu and $M_{Sr}$ is a number of moles of Sr;
synthesizing the mixture in a reducing atmosphere comprising hydrogen and nitrogen to obtain an intermediate product, the mixture being filled in a vessel formed of a non-oxide material;
mixing the intermediate product, the Si raw material, and an Al raw material selected from aluminum oxide and aluminum nitride, and synthesizing a resulting mixture in a reducing atmosphere comprising hydrogen and nitrogen to obtain a precursor; and
synthesizing the precursor in a nitrogen atmosphere under pressure.

16. The method according to claim 15, wherein $M_{Eu}$ and $M_{Sr}$ satisfy the condition of $0.01 \leq M_{Eu}/(M_{Sr}+M_{Eu}) \leq 0.03$.

17. The method according to claim 15, wherein the Sr raw material is selected from the group consisting of strontium oxide and strontium hydroxide.

18. The method according to claim 15, wherein the intermediate product has a composition represented by (Sr, Eu)$_2$Si$_5$N$_8$.

19. The method according to claim 15, wherein the non-oxide material forming the vessel is selected from the group consisting of boron nitride, carbon, silicon nitride, silicon carbide, aluminum nitride, sialon, molybdenum and tungsten.

* * * * *